United States Patent [19]

Dorinski

[11] Patent Number: 4,922,070
[45] Date of Patent: May 1, 1990

[54] SWITCH ASSEMBLY

[75] Inventor: Dale W. Dorinski, Coral Springs, Fla.

[73] Assignee: Motorola, Inc., Schaumburg, Ill.

[21] Appl. No.: 285,568

[22] Filed: Dec. 16, 1988

[51] Int. Cl.⁵ ............................................. H01H 1/10
[52] U.S. Cl. ..................................... 200/512; 200/515
[58] Field of Search ............ 200/5A, 86 R, 512–517, 200/83 N

[56] References Cited

U.S. PATENT DOCUMENTS

| 3,860,771 | 1/1975 | Lynn et al. | 200/5 A |
| 4,018,999 | 4/1977 | Robinson et al. | 200/5 A |
| 4,046,981 | 9/1977 | Johnson et al. | 200/5 A X |
| 4,074,088 | 2/1978 | Keough et al. | 200/5 A |
| 4,460,810 | 7/1984 | Fukukura | 200/5 A |
| 4,497,982 | 2/1985 | Michalski | 200/5 A X |
| 4,501,938 | 2/1985 | Kawauchi | 200/5 A |

Primary Examiner—J. R. Scott
Attorney, Agent, or Firm—Daniel K. Nichols

[57] ABSTRACT

A switch assembly includes a housing 25 having a recess 26 with switch contacts 23 in the recess. A flexible sheet 21 is affixed to the housing and covers the recess. The flexible sheet carries a conductive contact 22. When the sheet is depressed, its contact engage the contacts in the recess to complete an electrical circuit. The housing can be formed as a molded plastic member with the switch contacts being formed on the plastic member.

5 Claims, 2 Drawing Sheets

SWITCH ASSEMBLY

BACKGROUND OF THE INVENTION

The present invention relates to a switch assemblies in general and particularly to membrane type switches.

Membrane switches are used in many electronic devices such as calculators, appliance control panels, automotive dashboards, consumer toys, and industrial controls. These type of switches enjoy several advantages over conventional rocker, toggle or key switches, They can provide a liquid tight front surface, making them quite useful in environments where a switch or switch assembly might be exposed to liquid spills, corrosive chemicals, or moisture. They offer a reduced thickness, due to the absence of mechanical parts such as springs, rockers, wiring fasteners, and large housings. This feature is extremely desirable in applications such as thin calculators and other portable consumer electronic devices that must be worn on the person or carried in a pocket. Because of the absence of such parts, they have a lower cost of materials and assembly. This factor is quite important in consumer electronics. They provide a momentary contact, as opposed to permanent contact switch. This is important in applications such as calculators where a circuit is meant to be only briefly actuated.

FIG. 1 shows a cross sectional view of a typical membrane switch. In principal, a membrane switch is constructed much like a conventional switch, that is a movable contact is used to momentarily complete the connection between two sides of a circuit that are normally not connected. In membrane switches, the normally nonconnected sides of the circuit are formed on the surface of a rigid or flexible printed circuit board 10 that usually contains other circuitry 11 to interconnect the switch or switches to the remainder of the electronic device. The movable contact consists of a flexible plastic sheet 12 which has a conductive area 13 that serves to complete the circuit on the printed circuit board when it is moved into contact with it. The conductive area 13 on the flexible sheet is arranged so as to be facing the circuit board 10 and is aligned so as to be directly opposite the stationary contacts 14 on the circuit board. The flexible sheet 12 is bonded with an adhesive 15 to a spacer 16, which serves to maintain a fixed distance between the circuit board traces 14 and the movable contact 13. The spacer 16 is typically 2-10 mils thick, and is bonded using adhesive 15 to the circuit board 10. When a force is applied to the exterior side of the flexible sheet 12, the movable contact 13 is displaced into an opening in the spacer 16 and into engagement with the stationary contact 14 to close the switch.

This assembly is usually placed into a housing 17 or else it is bonded to another rigid member to provide rigidity and mechanical strength. FIG. 2 shows a cross sectional view of a membrane switch boonded to a metal plate 18. In order to prevent the circuit traces on the bottom side of the printed circuit board 10 from shorting to the metal plate 18, an insulator 19 is placed between the printed circuit board and the metal plate. This insulator 19 is typically bonded to the circuit board and the metal plate with a layer of adhesive 20 at each interface. The membrane switch assembly must be rigid enough to withstand any deflection incurred by the actuation force on the flexible sheet 12, or the entire assembly will deflect and the switch will not function. In addition, the spacer thickness and the size of the aperture in the spacer must be carefully controlled in order to maintain uniform actuation force on the switch. Misalignment or damage to the spacer during assembly is common and is cause for the switch to malfunction.

SUMMARY OF THE INVENTION

The switch assembly includes a member having a recessed area with contacts on the member within the recessed area. A flexible sheet is affixed to the member over the recessed area. The flexible sheet carries a conductive area that is engageable with the contacts when the sheet is depressed.

In one aspect of the invention, the member includes a second recessed area and the flexible sheet is affixed to the member within the second recessed area. In another aspect of the invention, the member is a molded housing. In still another aspect of the invention, the contacts are circuit traces formed on the housing.

DESCRIPTION OF THE PREFERRED EMBODIMENT

Figure 1:
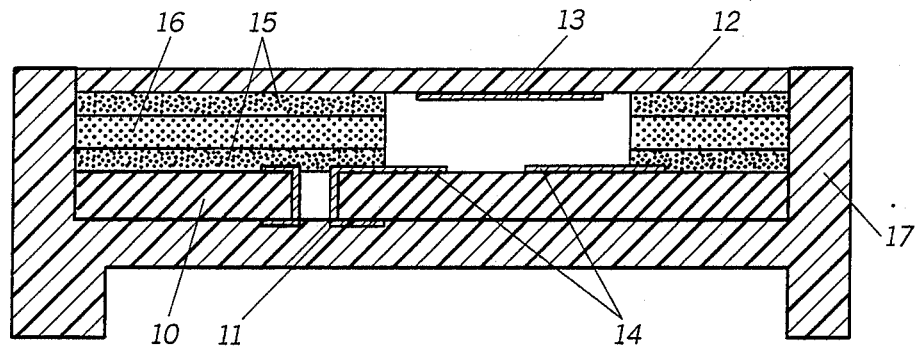
FIG. 1 is a cross-sectional view of a prior art membrane switch assembly.
Figure 2:
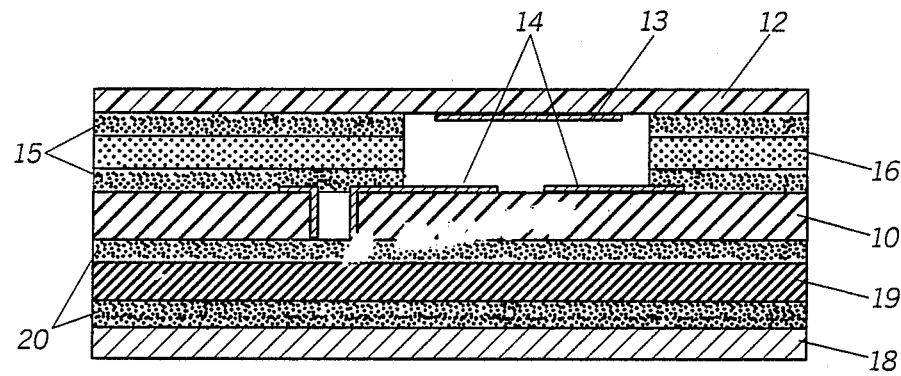
FIG. 2 is a cross-sectional view of another prior art membrane switch assembly.
Figure 3:
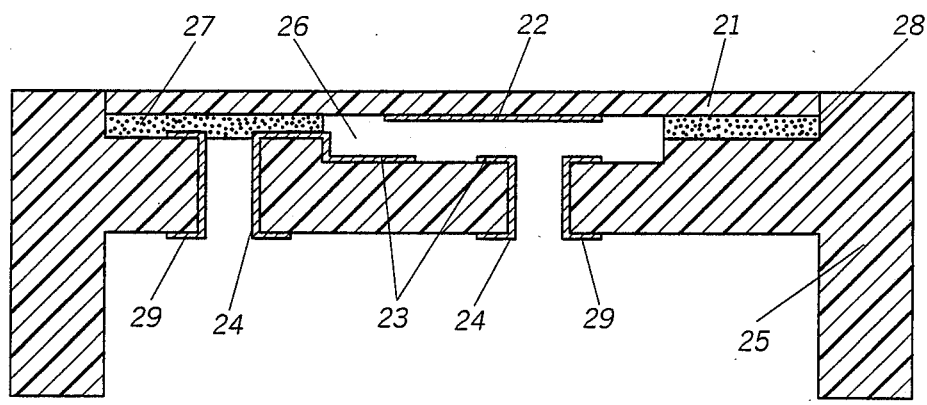
FIG. 3 is a cross-sectional view of a switch assembly in accordance with the present invention.

Referring now to FIG. 3, it will be understood that the keypad assembly includes a flexible sheet or membrane 21 which carries a metalized contact or conductive area 22 which comprises a moveable contact. The contact 22 is arranged so as to be in proximity with stationary contacts 23. The stationary contacts 23 and other interconnecting circuitry 24 are deposited directly onto the surface of a housing 25 which comprises a rigid member. A recess or recessed area 26 is formed in the housing 25 with the contacts 23 being located in the recess. The flexible plastic sheet 21 is bonded to the housing 25 as by adhesive 27. In the preferred embodiment, the housing 25 includes a second recess 28. The flexible sheet is located in the second recess 28 and completely covers the first recess 26. The depth of the second recess 28 can be approximately equal to the thickness of the flexible sheet 21 and adhesive 27 so as to provide a substantially planer upper surface. The depth of the first recess, which is located in the second recess 28, is selected to provide the normal spacing between the contacts 22 and 23.

In this embodiment, the housing 25 can be a case and provides several special functions. The housing 25 serves as the substrate upon which the electrical conductors 23 and 24 are placed, this eliminates the requirement of having a separate printed circuit board. The housing 25 serves to provide rigidity to the switch assembly, thereby eliminating the need for bonding to a metal plate or other rigid member. The recess 26 formed into the housing 25 serves to provide proper spacing between the movable contact 22 and the stationary contacts 23, eliminating the need for an additional spacer and the required alignment.

In the preferred embodiment, the stationary contacts 23 and the recess 26 are formed into a plastic case or housing during the injection molding cycle. The molding and provision of circuit traces is disclosed in pending U.S. patent applications Nos. 121,325, 121,326 and 204,838, filed Nov. 16, 1987, Nov. 16, 1987, and June 10, 1988 respectively which are assigned to the assignee of the present invention. The disclosures thereof, are incorporated by reference as if fully set out herein.

The recess 26 can be placed on the interior or the exterior of the housing 25, depending on the specific product requirements. If placed on the exterior, electrical interconnection to the interior of the housing is made by the use of plated through holes 29. The holes 29 are normally covered by the adhesive 27 and the flexible sheet 21, rendering the case liquid and dust tight.

It will be understood that this approach is not limited to a single switch on a housing or case, but may also be an array of switches such as a keypad or membrane switch pad. Such a keypad would include a plurality of contacts 22 on the flexible sheet 21. Each of the contacts 22 would be engageable with contacts 23 in separate recesses 26 of the housing. It should also be noted that the interconnecting circuitry does not necessarily have to be routed to the exterior of the recess 26, but could be placed entirely in the confines of the recess, in which case conventional imaging technology could be utilized to produce the stationary contacts 23. The stationary contacts 23 could also be mechanically formed from separate pieces of metal, placed into the recess and staked or otherwise connected to the housing. Such an arrangement may be desirable when a single switch is employed, as opposed to an array of switches. While additional circuitry and components are not illustrated, they and be provided within the housing 25. The housing thereby caries both the switch contacts as well as the circuitry for the electronic device.

Figure 4:
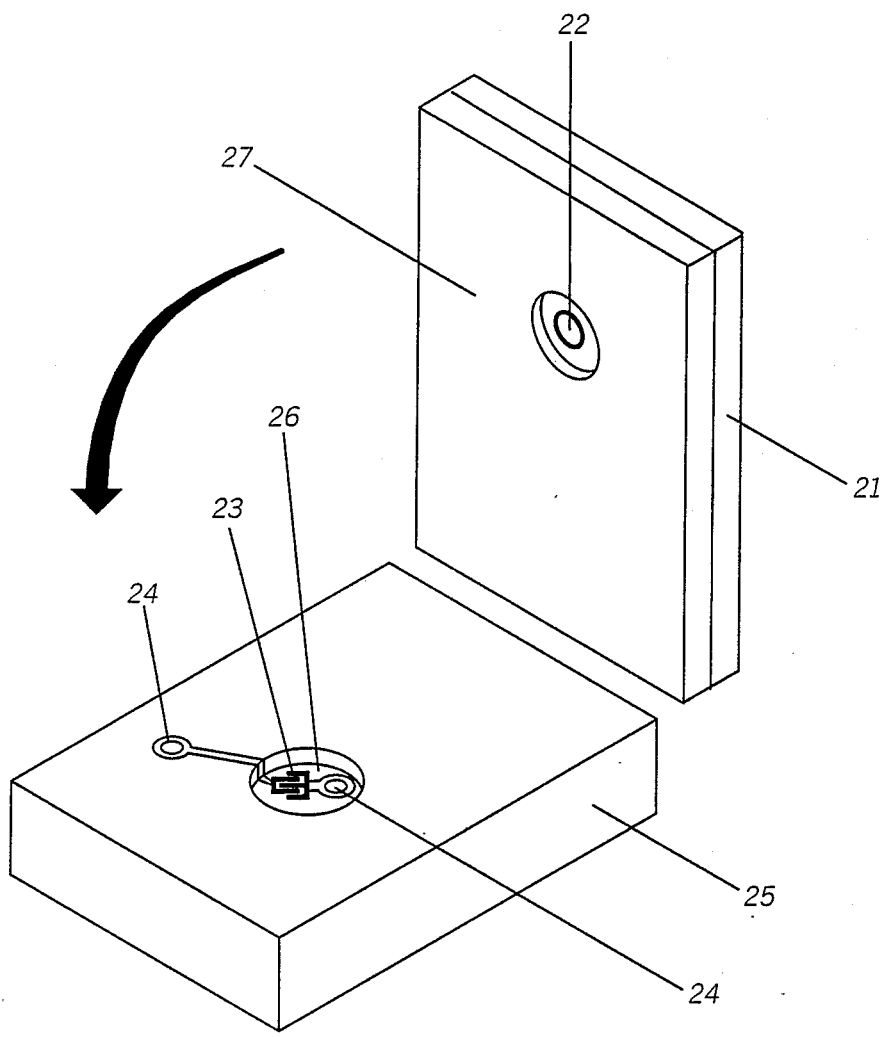
FIG. 4 is a perspective view of a switch assembly in accordance with the present invention showing the flexible layer separated from the assembly.

Instead of utilizing molded plastic, the stationary contact 23 and recess 26 could be formed into a planer substrate, such as ceramic, with the recess being cast into the ceramic while in the "green" state, prior to firing. The circuitry 23 and 24 is deposited as previously, illustrated. The use of shaped ceramic, is appropriate for the manufacture of a single component or module, rather than a housing FIG. 4 is a perspective view showing a switch assembly that is similar to that of FIG. 3, prior to attachment of the flexible sheet 21 to the housing 25. This view shows the relationship between the movable contact 22 and the fixed contacts 23 which can be formed as interdigitated fingers. Once the flexible sheet 21 is placed over the housing 25, it can be flexed or depressed so that the moveable contact 22 engages the contacts 23 to complete an electrical circuit.

I claim:

1. A switch assembly comprising:
    a housing member having first and second recessed areas, the first recessed area being located within the second recessed area;
    conductive traces providing contacts on the housing member within the first recessed area;
    the housing member including plated through holes connected to said contacts; and
    a flexible sheet affixed to the housing member, within the second recessed area and over the first recessed area, the sheet including a conductive area located over said contacts and engageable with the contacts when the flexible sheet is depressed.

2. A switch assembly as described in claim 1 in which:
    the housing member is part of a molded plastic housing.

3. A switch assembly as defined in claim 1, in which:
    the conductive traces include interdigitated fingers providing the contacts.

4. A switch assembly as defined in claim 1, in which:
    at least one of said plated through holes is located in said first recessed area.

5. A switch assembly as defined in claim 1, in which:
    the flexible sheet is affixed to the member by adhesive, and
    the flexible sheet and adhesive cover and seal at least one of said plated through holes.

* * * * *